(12) United States Patent
Liu et al.

(10) Patent No.: US 11,264,455 B2
(45) Date of Patent: Mar. 1, 2022

(54) BACKSIDE DEEP ISOLATION STRUCTURES FOR SEMICONDUCTOR DEVICE ARRAYS

(71) Applicant: Yangtze Memory Technologies Co., Ltd., Hubei (CN)

(72) Inventors: Wei Liu, Hubei (CN); Shunfu Chen, Hubei (CN); Cheng Gan, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 76 days.

(21) Appl. No.: 16/730,225

(22) Filed: Dec. 30, 2019

(65) Prior Publication Data

US 2021/0118989 A1 Apr. 22, 2021

Related U.S. Application Data

(63) Continuation of application No. PCT/CN2019/111580, filed on Oct. 17, 2019.

(51) Int. Cl.
*H01L 23/48* (2006.01)
*H01L 27/1157* (2017.01)
(Continued)

(52) U.S. Cl.
CPC ........ *H01L 29/0649* (2013.01); *H01L 23/481* (2013.01); *H01L 23/5226* (2013.01);
(Continued)

(58) Field of Classification Search
CPC ............. H01L 29/0649; H01L 27/1157; H01L 27/11573; H01L 23/481; H01L 23/5226;
(Continued)

(56) References Cited

U.S. PATENT DOCUMENTS 9,934,832 B2 * 4/2018 Shibata ................ H03K 5/1565
9,960,181 B1 5/2018 Cui et al.
(Continued)

FOREIGN PATENT DOCUMENTS

CN 101872788 A 10/2010
CN 104916646 A 9/2015
(Continued)

OTHER PUBLICATIONS

International Search Report and Written Opinion of the International Searching Authority directed to related International Patent Application No. PCT/CN2019/111580, dated Jul. 21, 2020, with attached English-language translation; 8 pages.

*Primary Examiner* — Kyoung Lee
(74) *Attorney, Agent, or Firm* — Sterne, Kessler, Goldstein & Fox P.L.L.C.

(57) ABSTRACT

A method for forming a three-dimensional memory device includes forming, on a first side of a first substrate, a plurality of semiconductor device arrays and forming a first interconnect layer on the plurality of semiconductor device arrays. The method also includes forming, on a second substrate, a memory array including a plurality of memory cells and a second interconnect layer. The method further includes bonding the first and second interconnect layers and forming one or more isolation trenches through a second side of the first substrate that is opposite to the first side to expose a portion of the first side of the first substrate. The one or more isolation trenches are formed between first and second semiconductor device arrays of the plurality of semiconductor devices arrays. The method further includes disposing an isolation material to form one or more isolation structures respectively in the one or more isolation trenches.

21 Claims, 11 Drawing Sheets

(51) Int. Cl.
  *H01L 29/06* (2006.01)
  *H01L 23/522* (2006.01)
  *H01L 23/528* (2006.01)
  *H01L 27/11565* (2017.01)
  *H01L 27/11573* (2017.01)
  *H01L 27/11582* (2017.01)

(52) U.S. Cl.
  CPC ...... *H01L 23/5283* (2013.01); *H01L 27/1157* (2013.01); *H01L 27/11565* (2013.01); *H01L 27/11573* (2013.01); *H01L 27/11582* (2013.01)

(58) Field of Classification Search
  CPC ........... H01L 23/5283; H01L 27/11565; H01L 27/11582; H01L 21/76224; H01L 25/16; H01L 21/76898; H01L 24/80; H01L 24/29; H01L 25/18; H01L 2225/06548; H01L 2225/06562; H01L 2225/06568; H01L 24/08; H01L 24/32; H01L 24/83; H01L 24/94; H01L 25/0657; H01L 25/50; H01L 24/05; H01L 27/11575; H01L 2224/08145; H01L 2224/29186; H01L 2224/32145; H01L 2224/80895; H01L 2224/83896; H01L 24/00; H01L 27/11563; H01L 27/11568; H01L 27/11578
  See application file for complete search history.

(56) References Cited

U.S. PATENT DOCUMENTS

| | | | |
|---|---|---|---|
| 9,997,452 | B1 | 6/2018 | Uchiyama |
| 10,002,836 | B2 | 6/2018 | Spitzlsperger et al. |
| 10,038,006 | B2 | 7/2018 | Furihata et al. |
| 10,049,915 | B2* | 8/2018 | Fong ................. H01L 25/50 |
| 10,347,654 | B1 | 7/2019 | Iwai et al. |
| 10,910,364 | B2* | 2/2021 | Or-Bach ............. H01L 45/1226 |
| 2010/0270593 | A1 | 10/2010 | Lung et al. |
| 2015/0263011 | A1 | 9/2015 | Hong |
| 2017/0148808 | A1 | 5/2017 | Nishikawa et al. |
| 2021/0036048 | A1 | 2/2021 | Lin |

FOREIGN PATENT DOCUMENTS

| | | |
|---|---|---|
| CN | 106170853 A | 11/2016 |
| CN | 107658317 A | 2/2018 |
| CN | 108377660 A | 8/2018 |
| CN | 108470711 A | 8/2018 |
| CN | 109037224 A | 12/2018 |
| CN | 109461737 A | 3/2019 |
| CN | 109887920 A | 6/2019 |
| WO | WO 2019/052127 A1 | 3/2019 |

* cited by examiner

BACKSIDE DEEP ISOLATION STRUCTURES FOR SEMICONDUCTOR DEVICE ARRAYS

CROSS-REFERENCE TO RELATED APPLICATIONS

This application claims priority to PCT Patent Application No. PCT/CN2019/111580, filed on Oct. 17, 2019, which is incorporated herein by reference in its entirety.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As such, memory density for planar memory cells approaches an upper limit. A three-dimensional (3D) memory architecture can address the density limitation in planar memory cells.

BRIEF SUMMARY

Embodiments of a three-dimensional (3D) capacitor structure for a memory device and methods for forming the same are described in the present disclosure.

In some embodiments, a method for forming a three-dimensional memory device includes forming, on a first side of a first substrate, a plurality of semiconductor device arrays and forming a first interconnect layer on the plurality of semiconductor device arrays. The method also includes forming, on a second substrate, a memory array including a plurality of memory cells and a second interconnect layer. The method further includes bonding the first and second interconnect layers and forming one or more isolation trenches through a second side of the first substrate that is opposite to the first side and exposing a portion of the first side of the first substrate. The one or more isolation trenches are formed between first and second semiconductor device arrays of the plurality of semiconductor devices arrays. The method further includes disposing an isolation material to form one or more isolation structures respectively in the one or more isolation trenches.

In some embodiments, the first substrate is thinned through the second side after bonding the first and second interconnect layers.

In some embodiments, thinning the first substrate includes exposing a deep well on the second side of the first substrate.

In some embodiments, a liner layer is disposed in the one or more isolation trenches before disposing the isolation material.

In some embodiments, a dielectric layer is disposed on the second side of the first substrate.

In some embodiments, the bonding includes direct bonding.

In some embodiments, a planarization process is performed to remove portions of the isolation material disposed on the second side of the first substrate.

In some embodiments, the plurality of semiconductor device arrays comprise high-voltage n-type devices or high-voltage p-type devices.

In some embodiments, a trench is formed in the first substrate and exposing a contact. Conductive material is disposed in the trench and on the contact to form a through silicon contact (TSC) where the TSC is electrically coupled to the contact.

In some embodiments, at least one contact pad is formed on the TSC and electrically coupled to the TSC.

In some embodiments, disposing the isolation material includes depositing silicon oxide material.

In some embodiments, bonding the first and second interconnect layers includes dielectric-to-dielectric bonding and metal-to-metal bonding at a bonding interface.

In some embodiments, a method for forming a three-dimensional memory device includes forming, on a first side of a first substrate, a peripheral circuitry including a plurality of high-voltage semiconductor device arrays. The method also includes forming a first interconnect layer on the peripheral circuitry and forming, on a second substrate, a memory array including a plurality of memory cells and a second interconnect layer. The method further includes bonding the first and second interconnect layers, such that at least one high-voltage semiconductor device of the plurality of high-voltage semiconductor device arrays is electrically coupled to at least one memory cell of the plurality of memory cells. The method also includes thinning the first substrate through a second side of the first substrate, wherein the second side is opposite to the first side. The method also includes forming a plurality of isolation trenches through a second side of the first substrate that is opposite to the first side and exposing a portion of the first side of the first substrate. The at least one isolation trench of the plurality of isolation trenches is formed between first and second high-voltage semiconductor device arrays of the plurality of high-voltage semiconductor devices arrays. The method further includes disposing an isolation material in the plurality of isolation trenches.

In some embodiments, the bonding includes direct bonding.

In some embodiments, a dielectric layer is disposed on the second side of the first substrate, wherein the plurality of isolation trenches extend through the dielectric layer.

In some embodiments, a liner layer is disposed in the isolation trench before disposing the isolation material.

In some embodiments, disposing the isolation material includes disposing silicon oxide material.

In some embodiments, a memory device includes a peripheral circuitry wafer and a memory array wafer. The peripheral circuitry wafer includes a first substrate and an array of high-voltage devices formed at a first side of the first substrate. The peripheral circuitry wafer also includes a first interconnect layer formed at the first side of the first substrate and a plurality of deep isolation structures formed on a second side of the first substrate that is opposite to the first side. At least one deep isolation structure of the plurality of deep isolation structures extends through the first substrate and is in physical contact with the first side of the first substrate. The memory array wafer includes a plurality of memory cells, wherein at least one high-voltage device of the array of high-voltage devices is electrically coupled to at least one memory cell of the plurality of memory cells. The memory array wafer further includes a second interconnect layer in physical contact with the first interconnect layer.

In some embodiments, the at least one deep isolation structure includes a liner layer and isolation material, wherein the liner layer is between the isolation material and the first substrate.

In some embodiments, the physical contact includes chemical bonds formed between the first and second interconnect layers.

In some embodiments, the at least one deep isolation structure includes silicon oxide.

In some embodiments, the first substrate includes a contact electrically coupled to a through silicon contact (TSC).

In some embodiments, the three-dimensional memory device also includes a contact pad in contact with and electrically coupled to the TSC.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
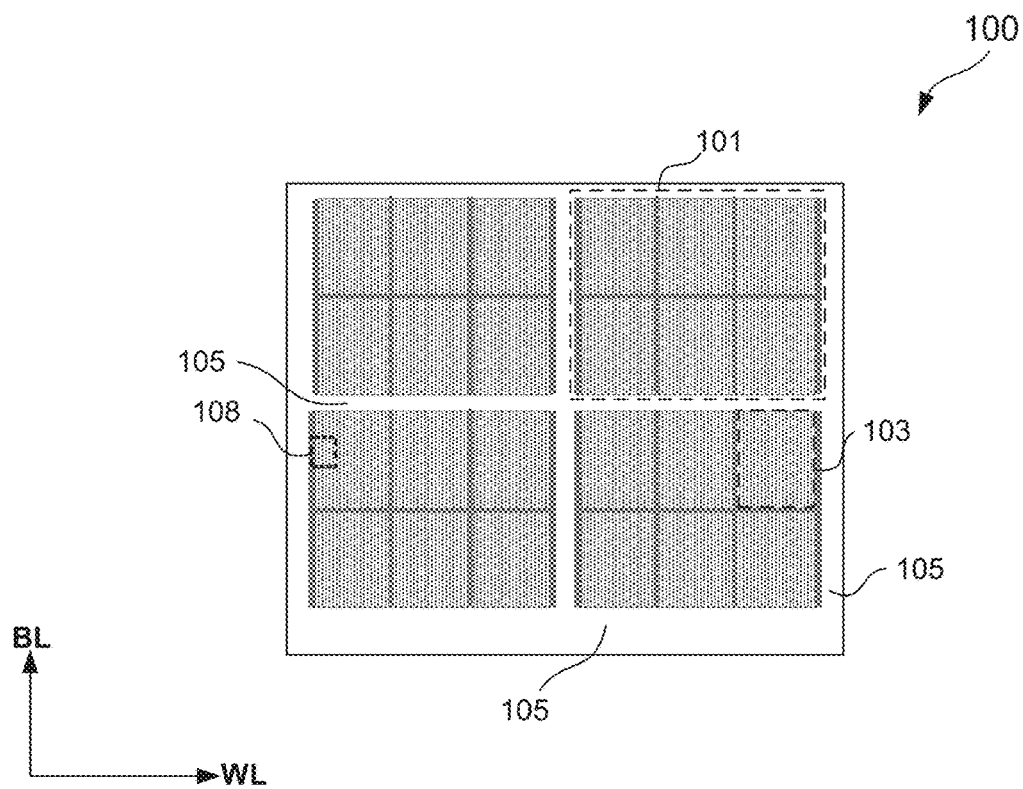
FIG. 1A illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

High-voltage devices such as high-voltage n-type or p-type devices are implemented in 3D memory cells to facilitate cell operation. In 3D memory circuits, arrays of high-voltage n-type or p-type devices can be placed in rows and columns to form controlling circuitry, such as decoder array (e.g., X-DEC or Y-DEC array). A selection of devices can be connected to high voltages (e.g., about 15V-25V) during operations, and large voltage differences (e.g., about 25V) can occur between adjacent arrays of devices. As such, sufficient isolation between arrays of high-voltage n-type and p-type devices needs to be implemented to prevent crosstalk between adjacent high-voltage devices. The development of 3D memory (e.g., 3D NAND flash memory) progress towards high density and high capacity memory cells and the number of devices and the number of metal wirings are continuously increasing. As separation between devices continues to shrink, high quality isolation structures are becoming more critical to prevent crosstalk between adjacent devices.

Various embodiments in accordance with the present disclosure provide structures and fabricating methods for isolation structures that improves isolation between high-voltage devices of 3D memory structures. A peripheral device wafer containing CMOS devices can be bonded to an array wafer containing 3D memory arrays. Isolation structures can be implemented in the bonded peripheral/memory array wafers to prevent crosstalk between adjacent arrays of devices, such as between arrays of high-voltage n-type devices or p-type. The isolation structures can be formed by thinning a dielectric layer of the peripheral wafer and forming through silicon isolation (TSI) structures to effectively separate different functional regions. By using isolation structures rather than relying on greater separation between devices or increasing dopant levels of those functional regions, the overall memory density and manufacturing cost of a 3D NAND flash memory can be improved.

FIG. 1A illustrates a top-down view of an exemplary three-dimensional (3D) memory device 100, according to some embodiments of the present disclosure. 3D memory device 100 can be a memory chip (package), a memory die or any portion of a memory die, and can include one or more memory planes 101, each of which can include a plurality of memory blocks 103. Identical and concurrent operations can take place at each memory plane 101. Memory block 103, which can be megabytes (MB) in size, can be the smallest size to carry out erase operations. Shown in FIG. 1, exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

3D memory device 100 also includes a periphery region 105, an area surrounding memory planes 101. Periphery region 105 can contain many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

The arrangement of memory planes 101 in 3D memory device 100 and the arrangement of memory blocks 103 in each memory plane 101 illustrated in FIG. 1 are only provided as an example, which does not limit the scope of the present disclosure.

Figure 1B:
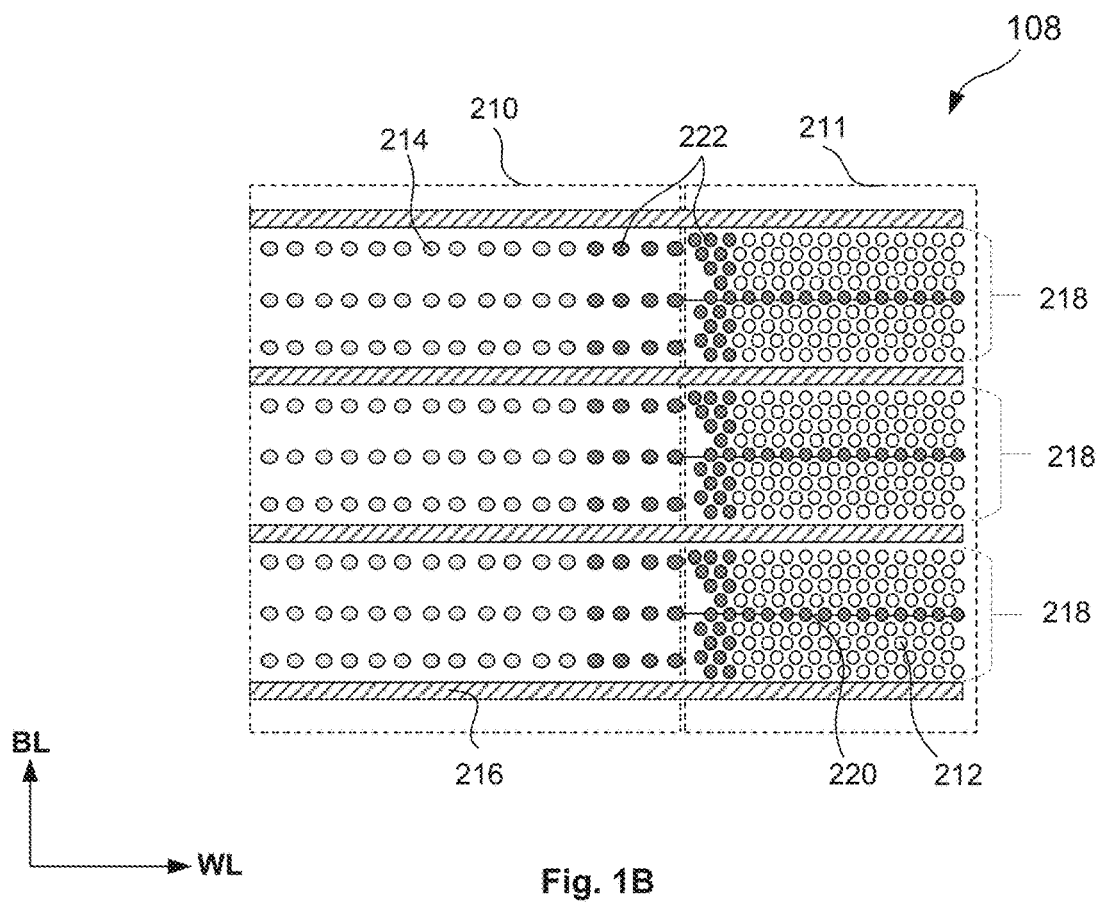
FIG. 1B illustrates a schematic top-down view of a region of 3D memory die, according to some embodiments of the present disclosure.

Referring to FIG. 1B, an enlarged top-down view of a region 108 in FIG. 1A is illustrated, according to some embodiments of the present disclosure. Region 108 of 3D memory device 100 can include a staircase region 210 and a channel structure region 211. Channel structure region 211 can include an array of memory strings 212, each including a plurality of stacked memory cells. Staircase region 210 can include a staircase structure and an array of contact structures 214 formed on the staircase structure. In some embodiments, a plurality of slit structures 216, extending in WL direction across channel structure region 211 and staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings for process variation control during fabrication and/or for additional mechanical support.

Figure 2:
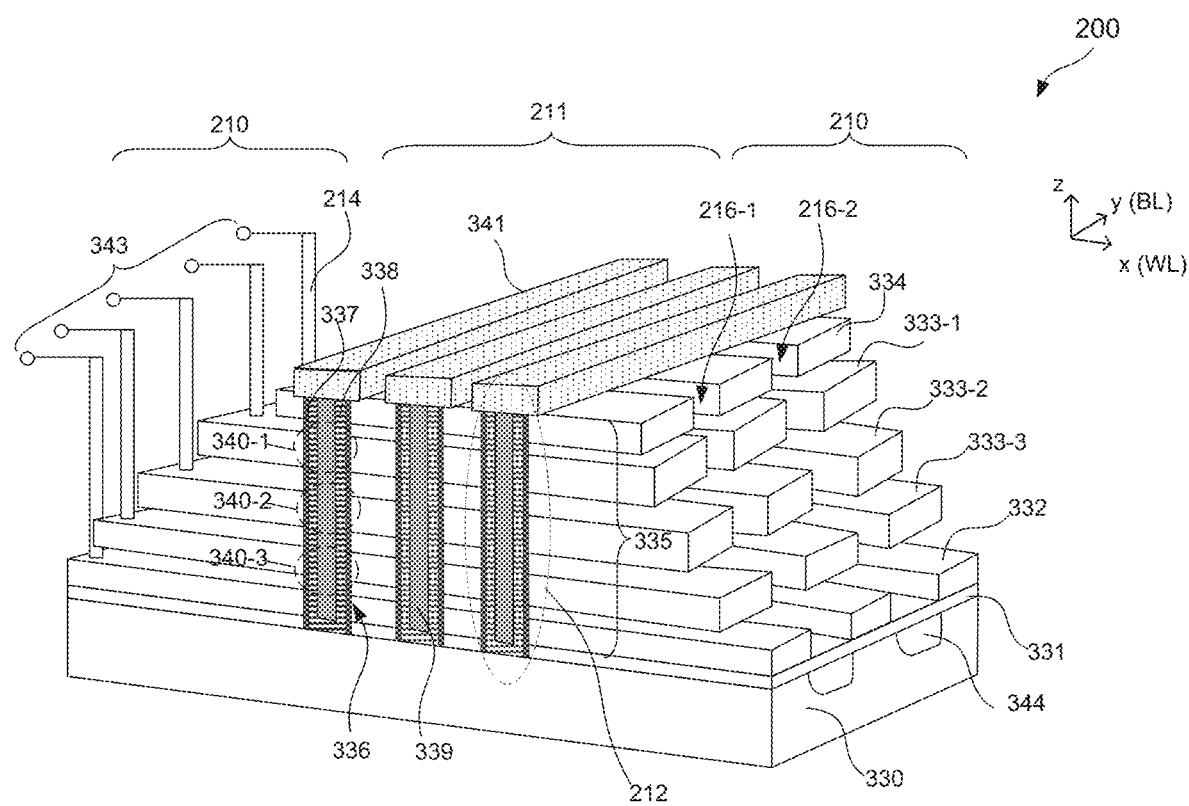
FIG. 2 illustrates a perspective view of a portion of an exemplary 3D memory array structure, in accordance with some embodiments of the present disclosure.

FIG. 2 illustrates a perspective view of a portion of an exemplary three-dimensional (3D) memory array structure 200, according to some embodiments of the present disclosure. Memory array structure 200 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 2 for clarity.

The control gates of each tier are separated by slit structures 216-1 and 216-2 through the film stack 335. Memory array structure 200 also includes a tier of top select gates (TSGs) 334 over the stack of control gates 333. The stack of TSG 334, control gates 333 and LSG 332 are also referred to as "gate electrodes." Memory array structure 300 further includes memory strings 212 and doped source line regions 344 in portions of substrate 330 between adjacent LSGs 332. Each memory strings 212 includes a channel hole 336 extending through insulating film 331 and film stack 335 of alternating conductive and dielectric layers. Memory strings 212 can also include a memory film 337 on a sidewall of the channel hole 336, a channel layer 338 over the memory film 337, and a core filling film 339 surrounded by the channel layer 338. A memory cell 340 can be formed at the intersection of control gate 333 and memory string 212. Memory array structure 300 further includes a plurality of bit lines (BLs) 341 connected with memory strings 212 over TSGs 334. Memory array structure 300 also includes a plurality of metal interconnect lines 343 connected with the gate electrodes through a plurality of contact structures 214. The edge of film stack 335 is configured in a shape of staircase to allow an electrical connection to each tier of the gate electrodes.

In FIG. 2, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. Memory array structure 200 can also include other structures, for example, TSG cut, common source contact and dummy channel structure. These structures are not shown in FIG. 2 for simplicity.

To achieve higher storage density, the number of vertical WL stacks of a 3D memory or the number of memory cells per memory string has been greatly increased, for example, from 24 stacked WL layers (i.e. 24L) to 128 layers or more. To further reduce the size of a 3D memory, the memory array can be stacked on top of the peripheral circuitry or vice versa. For example, the peripheral circuitry can be fabricated on a first substrate and the memory array can be fabricated on a second substrate. Then the memory array and the peripheral circuitry can be electrically coupled (e.g., electrically connected or in physical contact) through various interconnects by bonding the first and second substrates together. As such, not only the 3D memory density can be increased, but also communication between the peripheral circuitry and memory array can achieve higher bandwidth and lower power consumption since the interconnect lengths can be shorter through substrate (wafer) bonding.

With the increase in the density and performance of 3D memory devices, improvement in the peripheral circuitry is also needed to provide functional support for the memory array, for example, reading, writing and erasing the data of the memory cells. Isolation structures can be implemented in the bonded peripheral/memory array wafers to prevent crosstalk between adjacent structures, such as between wells of different doping types. The isolation structures can be formed by thinning a dielectric layer of the peripheral wafer and forming through silicon isolation (TSI) structures to effectively separate different functional regions.

Figure 3:
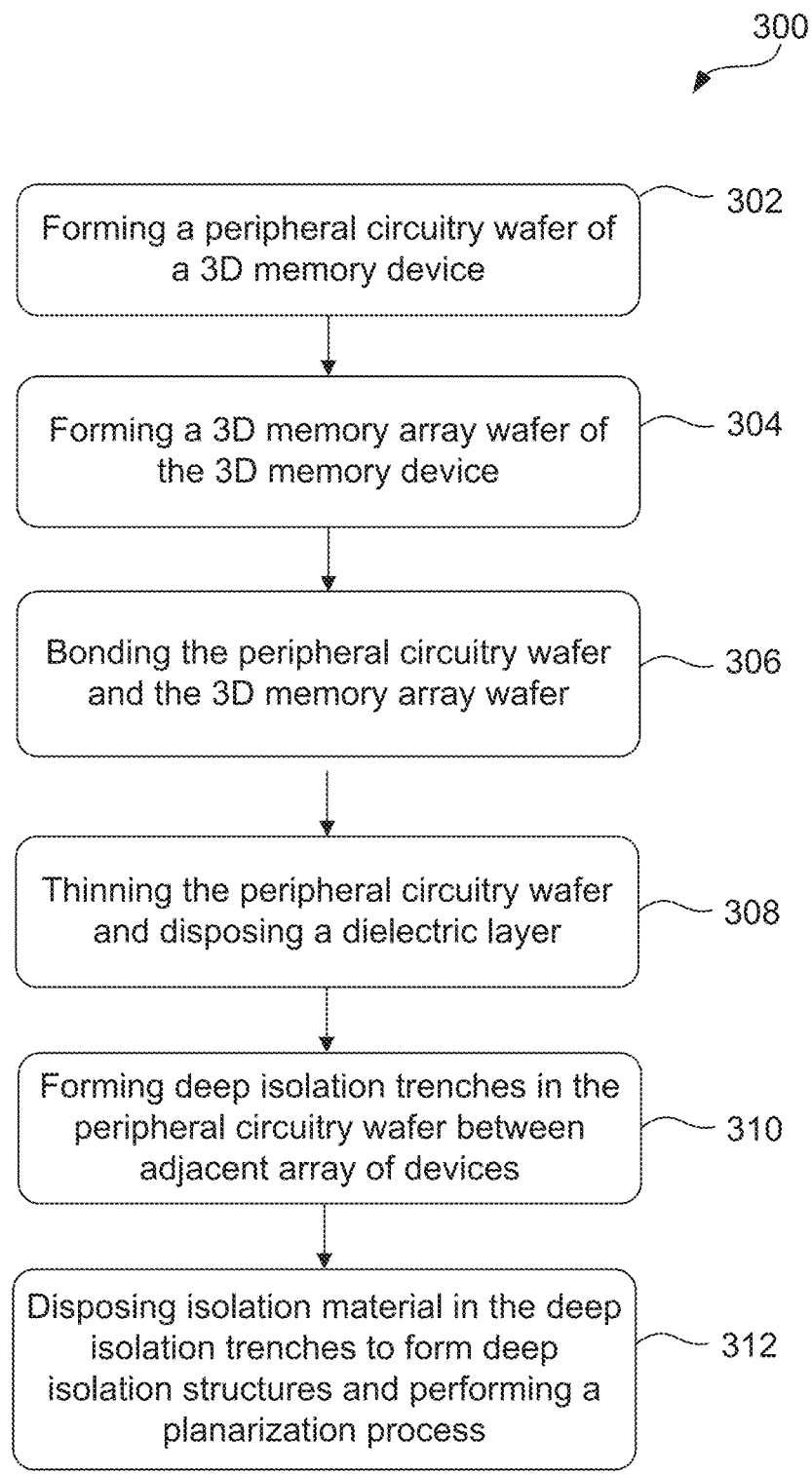
FIG. 3 illustrates a flow diagram of forming 3D memory array with deep isolation structures, in accordance with some embodiments of the present disclosure.

FIG. 3 is a flow diagram of an exemplary method 300 for forming isolation structures in 3D memory devices, in accordance with some embodiments of the present disclosure. A 3D memory device can be formed by connecting a peripheral circuitry wafer with a memory array wafer through wafer bonding and forming deep isolation structures in the peripheral circuitry wafer to prevent crosstalk. The operations of method 300 can be performed in a different order and/or vary, and method 300 can include more operations that are not described for simplicity. FIGS. 3-9 are cross-sectional views of fabricating an exemplary semiconductor structure 300 incorporating isolation structures. FIGS. 3-9 are provided as exemplary cross-sectional views to facilitate in the explanation of method 300. Although the fabrication process of forming isolation structures in a dielectric layer is described here as an example, the fabrication process can be applied on various other layers, such as on interlayer dielectrics, insulation layers, conductive layers, and any other suitable layers. The fabrication processes provided here are exemplary, and alternative processes in accordance with this disclosure may be performed that are not shown in these figures.

Figure 4:
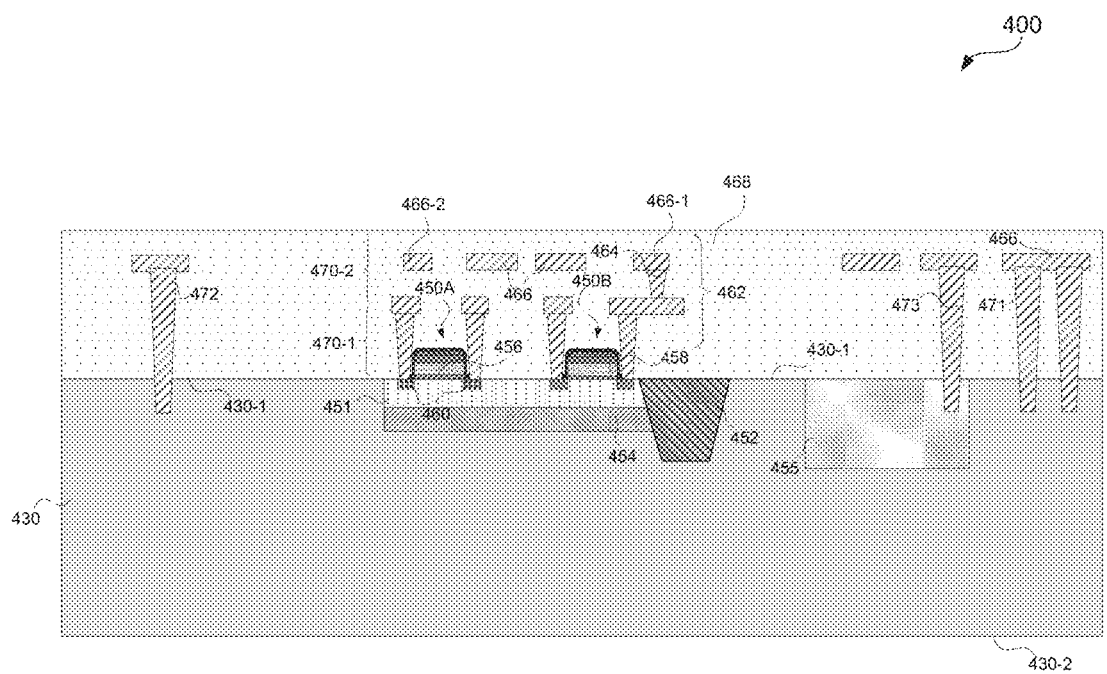
FIG. 4 illustrates a cross-sectional view of a peripheral circuitry having high-voltage device arrays, according to some embodiments of the present disclosure.

At operation 302, peripheral circuitry wafer of a 3D memory device is formed, according to some embodiments of the present disclosure. Referring to FIG. 4, peripheral circuitry 400 can include various components of a 3D memory device, such as, first substrate 430, arrays of peripheral devices such as an array of high-voltage devices 450A and an array of high-voltage devices 450B, shallow trench isolation (STI) 452, first well 451, second well 454, gate stack 456, gate spacer 458, and peripheral interconnect layer 462. In some embodiments, arrays of high-voltage devices 450A and 450B can include high-voltage n-type devices. Other high-voltage devices of the array of high-voltage devices can be formed in parallel with high-voltage devices 450A and 450B are not shown in FIG. 4 for simplicity. In some embodiments, first wells 451 can be p-type wells doped with p-type dopants. In some embodiments, second wells 454 can be a n-type well doped with n-type dopants. Arrays of peripheral devices 450A and 450B can be portions of a decoder array for controlling 3D memory devices. For example, arrays of peripheral devices 450A and 450B can be used for X-DEC and/or Y-DEC arrays.

First substrate 430 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, the first substrate 430 can be double-side polished prior to peripheral device fabrication. In this example, the first substrate 430 includes surfaces on the top and bottom sides (also referred to as a first side 430-1 and a second side 430-2, or a front side and a backside, respectively) both polished and treated to provide a smooth surface for high quality semiconductor devices. The first and second sides are opposite sides of first substrate 430.

Peripheral circuitry 400 can include one or more peripheral devices 450A and 450B on the first substrate 430. Peripheral devices 450A and 450B are adjacent to each other and can be formed on first substrate 430, in which the entirety or part of the peripheral devices 450A and 450B are formed in first substrate 430 (e.g., below the top surface of the first substrate 430) and/or directly on the first substrate 430. Peripheral devices 450A and 450B can include any suitable semiconductor devices, for example, peripheral devices 450A and 450B can be high-voltage n-type devices such as high-voltage NFET or high-voltage p-type devices such as high-voltage PFET. Peripheral devices 450A and 450B can be different types of devices, for example, peripheral devices 450A can be high-voltage n-type devices and peripheral devices 450B can be high-voltage p-type devices. In some embodiments, Peripheral devices 450A and 450B can also be metal oxide semiconductor field effect transistors (MOSFETs), bipolar junction transistors (BJTs), diodes, resistors, capacitors, inductors, etc. Among the semiconductor devices, p-type and/or n-type MOSFETs (i.e., CMOS) are widely implemented in logic circuit design, and are used as examples for peripheral devices 450A and 450B in the present disclosure. Therefore, peripheral circuitry 400 can also be referred to as CMOS wafer 400. The array of peripheral devices can include peripheral devices 450A and 450B that are either p-channel MOSFETs or n-channel MOSFETs and can include, but not limited to, an active device region surrounded by shallow trench isolation (STI) 452, a gate stack 456 that includes a gate dielectric, a gate conductor and/or a gate hard mask. First and second wells 451 and 454 can be any suitable wells for array of peripheral devices 450A and 450B. For example, first well 451 can be a high-voltage p-type well doped with suitable p-type dopants. Second well 454 can be a deep n-type well doped with suitable n-type dopants. Array of peripheral devices 450A and 450B can also include a source/drain extension and/or halo region (not shown in FIG. 4), a gate spacer 458 and pairs of source/drains 460 located on each side of the gate stack. Peripheral devices 450A and 450B can further include silicide contact areas (not shown) in the top portion of the source/drain. Other suitable devices can be also formed on first substrate 430.

ST 452 can be formed through patterning the substrate using lithography and etching, filling an insulating material and polishing the insulating material to form a coplanar surface on first substrate 430. STI 452 can be formed at a border of the array of peripheral devices 450A and 450B to provide isolation of the array of peripheral devices from other adjacent structures, such as deep well 455. An insulating material for STI can include silicon oxide, silicon oxynitride, TEOS, low-temperature oxide (LTO), high temperature oxide (HTO), silicon nitride, etc. An insulating material for STI 452 can be disposed using techniques such as chemical vapor deposition (CVD), physical vapor deposition (PVD), plasma-enhanced CVD (PECVD), low pressure chemical vapor deposition (LPCVD), high density plasma (HDP) chemical vapor deposition, rapid thermal chemical vapor deposition (RTCVD), metal organic chemical vapor deposition (MOCVD), atomic layer deposition (ALD), sputtering, thermal oxidation or nitridation, or combinations thereof. The forming of STI 452 can also include a high temperature annealing step to densify the disposed insulating material for improved electrical isolation.

First and second third wells 451 and 454 of the array of peripheral devices 450A and 450B can include p-type and/or n-type doping for forming n-channel or p-channel MOSFET. For example, arrays of peripheral devices 450A and 450B can be arrays of high-voltage p-type devices such as HVPFET. In some embodiments, arrays of peripheral devices 450A and 450B can be high-voltage n-type devices such as HVNFET and first well 451 can be a high-voltage p-type well and second well 454 can be a deep n-type well. The dopant profile and concentration of first and second wells 451 and 454 can affect the device characteristics of peripheral devices 450A and/or 450B. For MOSFET devices with low threshold voltage ($V_t$), one or more suitable wells can be doped with lower concentration, and can form low-voltage p-well or low-voltage n-well. For MOSFET with high $V_t$, one or more suitable wells can be doped with higher concentration, and can form high-voltage p-well or high-voltage n-well. In some embodiments, to provide electrical isolation from a p-type substrate, a deep n-well can be formed underneath a high-voltage p-well for an n-channel MOSFET with high $V_t$. Peripheral devices 450A and 450B can be devices operated under any suitable conditions. For example, peripheral device 450A can be a low-voltage device while peripheral device 450B can be a high-voltage device, and suitable wells can be n-type well embedded in substrate 430 that can be a p-type substrate. In some embodiments, other wells and structures can be included.

The forming of an n-well can include any suitable n-type dopant, such as phosphorus, arsenic, antimony, etc., and/or any combination thereof. The forming of a p-well can include any suitable p-type dopant, for example boron. The dopant incorporation can be achieved through ion implantation followed by activation anneal, or through in-situ doping during epitaxy for the active device region.

Gate stacks 456 of arrays of peripheral devices 450A and 450B can be formed by a "gate first" scheme, where gate stacks 456 are disposed and patterned prior to source/drain formation. Gate stacks 456 of the arrays of peripheral devices 450A and 450B can also be formed by a "replacement" scheme, where a sacrificial gate stack can be formed first and then replaced by a high-k dielectric layer and a gate conductor after source/drain formation.

In some embodiments, the gate dielectric can be made of silicon oxide, silicon nitride, silicon oxynitride, and/or high-k dielectric films such as hafnium oxide, zirconium oxide, aluminum oxide, tantalum oxide, magnesium oxide, or lanthanum oxide films, and/or combinations thereof. The gate dielectric can be disposed by any suitable methods such as CVD, PVD, PECVD, LPCVD, RTCVD, sputtering, MOCVD, ALD, thermal oxidation or nitridation, or combinations thereof.

In some embodiments, the gate conductor can be made from a metal or metal alloy, such as tungsten, cobalt, nickel, copper, or aluminum, and/or combinations thereof. In some embodiments, the gate conductor can also include a conductive material, such as titanium nitride (TiN), tantalum nitride (TaN), etc. The gate conductor can be formed by any suitable deposition methods, for example, sputtering, thermal evaporation, e-beam evaporation, ALD, PVD, and/or combinations thereof.

In some embodiments, the gate conductor can also include a poly-crystalline semiconductor, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, or arsenic, etc. In some embodiments, the gate conductor can also be an amorphous semiconductor with aforementioned materials.

In some embodiments, the gate conductor can be made from a metal silicide, including $WSi_x$, $CoSi_x$, $NiSi_x$, or $AlSi_x$, etc. The forming of the metal silicide material can include forming a metal layer and a poly-crystalline semiconductor using similar techniques described above. The forming of metal silicide can further include applying a thermal annealing process on the deposited metal layer and the poly-crystalline semiconductor layer, followed by removal of unreacted metal.

Gate spacers 458 can be formed through disposing an insulating material and then performing anisotropic etching. The insulating material for gate spacers 458 can be any insulator, including silicon oxide, silicon nitride, silicon oxynitride, TEOS, LTO, HTO, etc. Gate spacers 458 can be disposed using techniques such as CVD, PVD, PECVD, LPCVD, RTCVD, MOCVD, ALD, sputtering, or combinations thereof. The anisotropic etching of gate spacer 458 includes dry etching, for example reactive ion etching (RIE).

A length of gate stack 456 between source/drain 460 is an important feature of the MOSFET. The gate length determines the magnitude of drive current of a MOSFET and is therefore scaled down aggressively for logic circuits. The gate length can be less than about 100 nm. In some embodiments, the gate length can be in a range between about 5 nm to about 30 nm. Patterning of the gate stack with such a small dimension is very challenging, and can use techniques including optical proximity correction, double exposure and/or double etching, self-aligned double patterning, etc.

In some embodiments, source/drains 460 of peripheral devices 450A and 450B can be incorporated with high concentration dopants. For n-type MOSFETs, the dopant for source/drains 460 can include any suitable n-type dopant, such as phosphorus, arsenic, antimony, etc., and/or any combination thereof. For p-type MOSFETs, the dopant for source/drains 460 can include any suitable p-type dopant, for example boron. The dopant incorporation can be achieved through ion implantation followed by dopant activation anneal. Source/drains 460 can be made of the same material as first substrate 430, for example, silicon. In some embodiments, source/drains 460 of each device of the array of peripheral devices 450A and 450B can be made of a different material from first substrate 430 to achieve high performance. For example, on a silicon substrate, source/drains 460 for a p-type MOSFETs can include SiGe and source/drain 460 for an n-type MOSFETs can be incorporated with carbon. The forming of source/drain 460 with a different material can include etching back the substrate material in the source/drain area and disposing new source/drain material using techniques such as epitaxy. Doping for source/drain 460 can also be achieved through in-situ doping during epitaxy.

Peripheral devices 450A and 450B can also have an optional source/drain extension and/or halo region (not shown in FIG. 4) along each side of gate stack 456. The source/drain extension and/or halo region locates inside the active device region below the gate stack, and is implemented mainly for improved short channel control for peripheral devices 450A and 450B with a channel length less than about 0.5 μm. The forming of the source/drain extension and/or halo region can be similar to the forming of source/drain 460, but may use different implantation conditions (e.g., dose, angle, energy, species, etc.) to obtain optimized doping profile, depth or concentration.

Peripheral devices 450A and 450B can be formed on first substrate 430 with a planar active device region (as shown in FIG. 4), where the direction of MOSFET's channel and current flow is parallel to a surface of first substrate 430. In some embodiments, peripheral devices 450A and 450B can also be formed on first substrate 430 with a 3D active device region, for example a so-called "finFET" in a shape like a "fin" (not shown), where the gate stack of the MOSFET is wrapped around the fin, and the MOSFET's channel lies along three sides of the fin (top and two sidewalls under the gate).

In some embodiments, peripheral circuitry 400 can include a peripheral interconnect layer 462 (or a first interconnect layer), above peripheral devices 450A and 450B, to provide electrical connections between different peripheral devices 450A and 450B and external devices (e.g., power supply, another chip, I/O device, etc.). Peripheral interconnect layer 462 can include one or more interconnect structures, for example, one or more vertical contact structures 464 and one or more lateral conductive lines 466. Contact structure 464 and conductive line 466 can broadly include any suitable types of interconnects, such as middle-of-line (MOL) interconnects and back-end-of-line (BEOL) interconnects. Contact structure 464 and conductive line 466 in peripheral circuitry 400 can include any suitable conductive materials such as tungsten (W), cobalt (Co), copper (Cu), titanium (Ti), tantalum (Ta), aluminum (Al), titanium nitride (TiN), tantalum nitride (TaN), nickel, silicides ($WSi_x$, $CoSi_x$, $NiSi_x$, $AlSi_x$, etc.), metal alloys, or any combination thereof. The conductive materials can be deposited by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof.

Peripheral interconnect layer 462 can further include an insulating layer 468. Insulating layer 468 in peripheral interconnect layer 462 can include insulating materials, for example, silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof.

In FIG. 4, two conductive levels 470-1 and 470-2 (also referred to as "metal levels") are illustrated as an example, where each metal level can include contact structures 464 and conductive lines 466 where conductive lines 466 of the same metal level are located at the same distance from first substrate 430. The number of metal levels 470 for peripheral circuitry 400 is not limited and can be any number optimized for the performance of the 3D memory.

Peripheral interconnect layer 462 can be formed by stacking metal levels 470 from bottom to top of peripheral circuitry 400. In the example of peripheral circuitry 400 in FIG. 4, bottom metal level 470-1 can be formed first and then upper metal level 470-2 can be formed on top of bottom metal level 470-1. Fabrication processes of each metal level 470 can include, but not limited to, disposing a portion of the insulating layer 468 with a thickness required for the metal level, patterning the portion of insulating layer 468 using photo lithography and dry/wet etching to form contact holes for contact structures 464 and conductive lines 466, disposing conductive materials to fill the contact holes for contact structures 464 and conductive lines 466, and removing excessive conductive materials outside the contact holes by using planarization process such as chemical mechanical polishing (CMP) or reactive ion etching (RIE).

In some embodiments, peripheral circuitry 400 also includes one or more substrate contacts 472, where substrate contacts 472 provide electrical connections to first substrate 430. Substrate contact 472 can include one or more conductive levels 470 with multiple tiers of vertical contact structures 464 and lateral conductive lines 466. In FIG. 4, substrate contact 472 with one tier of contact structure and conductive line is shown as an example, where the vertical contact structure of substrate contact 472 extends through insulating layer 468 and electrically contacts first substrate 430. In some embodiments, peripheral circuitry 400 can also include contacts 471 to provide electrical connections to suitable devices embedded in insulating layer 468. Contacts 471 can be electrically coupled to lateral conductive line 466.

In some embodiments, the topmost conductive lines 466 (e.g., 466-1 and 466-2 in FIG. 4) can be exposed as the top surface of peripheral circuitry 400, where the topmost conductive lines 466-1 and/or 466-2 can be directly connected with the conductive lines on another chip or an external device.

In some embodiments, topmost conductive lines 466-1 and 466-2 can be embedded inside insulating layer 468 (as shown in FIG. 4), where the insulating material on top of conductive lines 466 provide scratch protection during shipping or handling. Electrical connections to the topmost conductive lines 466 can be established later by forming metal VIAs, or simply by etching back the insulating layer 468 using dry/wet etching.

Array of peripheral devices 450A and 450B, however, is not limited to MOSFET. The structures of the other devices, for example diodes, resistors, capacitors, inductors, BJTs, etc., can be formed simultaneously during MOSFETs fabrication through different mask design and layout. To form devices other than MOSFETs, process steps can be added or modified in a MOSFET's process flow, for example, processes to obtain different dopant profiles, film thicknesses or material stacks, etc. In some embodiments, the array of peripheral devices 450A and 450B other than MOSFET can also be fabricated with additional design and/or lithography mask levels to achieve specific circuit requirements.

In some embodiments, a plurality of peripheral devices 450A and 450B can be used to form any digital, analog, and/or mixed-signal circuits for the operation of the peripheral circuitry 400. Peripheral circuitry 400 can perform, for example, row/column decoding, timing and control, reading, writing and erasing data of the memory array, etc.

In some embodiments, a deep well 455 can be formed in first substrate 430 while forming wells for MOSFETs. Deep well 455 can extend into substrate 430 at a sufficient depth, for example at about 2 μm to about 10 μm below first surface 430-1 of substrate 430 in order to preserve transistor characteristics and to, for example, prevent leakage. Deep well 455 can be p-type doped or n-type doped. The n-type dopant can be phosphorus, arsenic, antimony, etc. The p-type dopant can be, for example, boron. The dopant incorporation can be achieved through ion implantation of first substrate 430, followed by activation anneal. In some embodiments, deep well 455 can be formed on first substrate 430 through epitaxy and in-situ doping. The implantation for deep well 455 can be performed right before or after the implantation of other suitable wells. The dopant activation anneal for deep well 455 can be performed simultaneously as that for other suitable wells. In some embodiments, a deep well contact 473 can be formed to provide electrical connections to the deep well 455. In some embodiments, deep well contact 473 forms ohmic contact with deep well 455. Deep well contact 473 can form electrical connection with corresponding circuits of peripheral circuitry 400 through contact structures 464 and conductive lines 466 in peripheral interconnect layer 462. For example, deep well contact 473 can be connected with the ground, substrate contact 472 of first substrate 430, source or drain 460 or gate stack 456 of peripheral devices 450A and 450B, etc.

Figure 5:
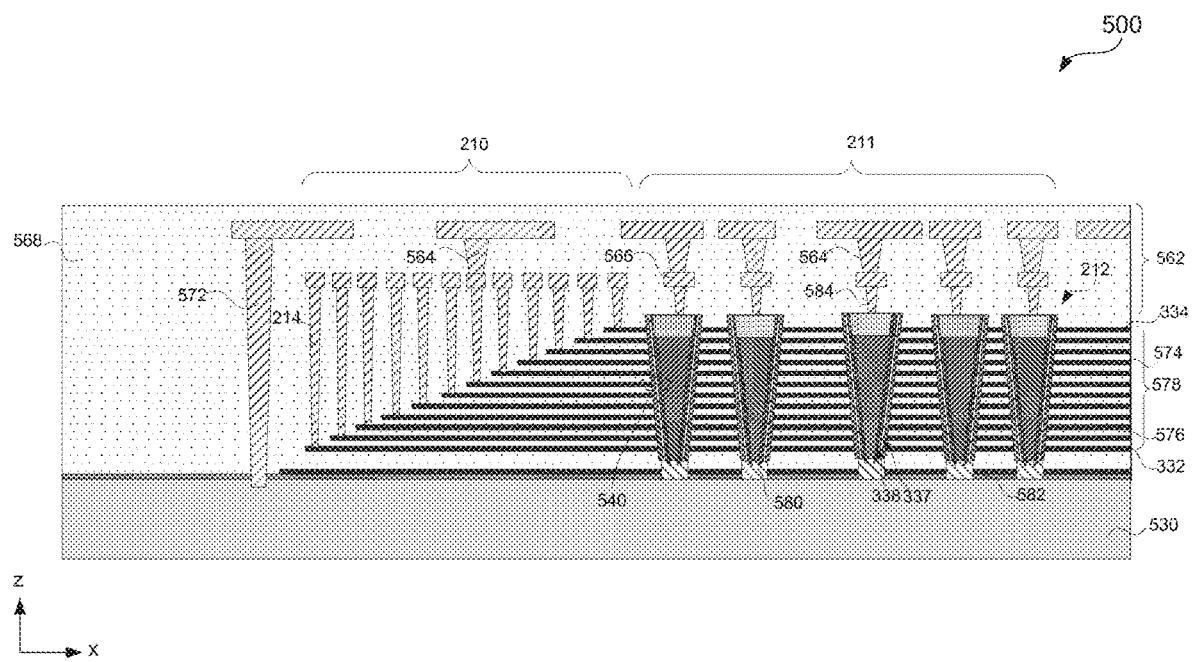
FIG. 5 illustrates a cross-sectional view of a memory array, according to some embodiments of the present disclosure.

At operation 304, a 3D memory array is formed, according to some embodiments of the present disclosure. Referring to FIG. 5, 3D memory array 500 can be a 3D NAND memory array and can include a second substrate 530, memory cells 540, and an array interconnect layer 562 (or a second interconnect layer). Second substrate 530 can be similar to first substrate 430. Memory cells 540 can be similar to memory cells 340-1, 340-2, or 340-3 described above with reference to FIG. 2. Array interconnect layer 562 can be similar to peripheral interconnect layer 462 and can be formed using similar materials and similar processes. For example, interconnect structures (e.g., contact structures 564 and conductive lines 566) and insulating layer 568 of array interconnect layer 562 are similar to interconnect structures (e.g., contact structures 464, conductive lines 466) and insulating layer 468 of peripheral interconnect layer 462, respectively.

In some embodiments, 3D memory array 500 can be a memory array for 3D NAND flash memory in which memory cells 540 can be stacked vertically as memory strings 212. Memory string 212 extends through a plurality of conductor layer 574 and dielectric layer 576 pairs. The plurality of conductor/dielectric layer pairs are also referred to herein as an "alternating conductor/dielectric stack" 578. Conductor layers 574 and dielectric layers 576 in alternating conductor/dielectric stack 578 alternate in the vertical direction. In other words, except the ones at the top or bottom of alternating conductor/dielectric stack 578, each conductor layer 574 can be sandwiched by two dielectric layers 576 on both sides, and each dielectric layer 576 can be sandwiched by two conductor layers 574 on both sides. Conductor layers 574 can each have the same thickness or have different thicknesses. Similarly, dielectric layers 576 can each have the same thickness or have different thicknesses. In some embodiments, alternating conductor/dielectric stack 578 includes more conductor layers or more dielectric layers with different materials and/or thicknesses than the conductor/dielectric layer pair. Conductor layers 574 can include conductor materials such as tungsten, cobalt, copper, aluminum, titanium, tantalum, titanium nitride, tantalum nitride, nickel, doped silicon, silicides (e.g., NiSix, WSix, CoSix, TiSix) or any combination thereof. Dielectric layers 576 can include dielectric materials such as silicon oxide, silicon nitride, silicon oxynitride, or any combination thereof.

As shown in FIG. 5, each memory string 212 can include channel layer 338 and memory film 337. In some embodiments, channel layer 338 includes silicon, such as amorphous silicon, polysilicon, or single crystalline silicon. In some embodiments, memory film 337 is a composite layer including a tunneling layer, a storage layer (also known as "charge trap/storage layer"), and a blocking layer. Each memory string 212 can have a cylinder shape (e.g., a pillar shape). Channel layer 338, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, memory film 337 includes ONO dielectrics (e.g., a tunneling layer including silicon oxide, a storage layer including silicon nitride, and a blocking layer including silicon oxide).

In some embodiments, each conductor layer 574 in alternating conductor/dielectric stack 578 can act as the control gate for each memory cell of memory string 212 (for example control gates 333 in FIG. 3). As shown in FIG. 5, memory string 212 can include lower select gate 332 (e.g., a source select gate) at a lower end of the memory string 212. Memory string 212 can also include top select gate 334 (e.g., a drain select gate) at an upper end of the memory string 212. As used herein, the "upper end" of a component (e.g., memory string 212) is the end further away from second substrate 530 in the z-direction, and the "lower end" of the component (e.g., memory string 212) is the end closer to second substrate 530 in the z-direction. As shown in FIG. 5, for each memory string 212, drain select gate 334 can be above source select gate 332. In some embodiments, select gates 332/334 include conductor materials such as tungsten, cobalt, copper, aluminum, doped silicon, silicides, or any combination thereof.

In some embodiments, 3D memory array 500 includes an epitaxial layer 580 on an lower end of channel layer 338 of memory string 212. Epitaxial layer 580 can include a semiconductor material, such as silicon. Epitaxial layer 580 can be epitaxially grown from a semiconductor layer 582 on second substrate 530. Semiconductor layer 582 can be un-doped, partially doped (in the thickness direction and/or the width direction), or fully doped by p-type or n-type dopants. For each memory string 212, epitaxial layer 580 is referred to herein as an "epitaxial plug." Epitaxial plug 580 at the lower end of each string 212 can contact both channel layer 338 and a doped region of semiconductor layer 582. Epitaxial plug 580 can function as the channel of lower selective gate 332 at the lower end of memory string 212.

In some embodiments, the array device further includes multiple contact structures 214 of word lines (also referred to as word line contacts) in staircase region 210. Each word line contact structure 214 can form electrical contact with the corresponding conductor layer 574 in the alternating conductor/dielectric stack 578 to individually control the memory cell 340. Word line contact structure 214 can be formed by dry/wet etching of a contact hole, followed by filling with a conductor, for example, tungsten, titanium, titanium nitride, copper, tantalum nitride, aluminum, cobalt, nickel, or any combination thereof.

As shown in FIG. 5, 3D memory array 500 also includes bit line contacts 584 formed on the top of memory strings 212 to provide individual access to channel layer 338 of memory strings 212. The conductive lines connected with the word line contact structures 214 and bit line contacts 584 form word lines and bit lines of 3D memory array 500, respectively. Typically the word lines and bit lines are laid perpendicular to each other (e.g., in rows and columns, respectively), forming an "array" of the memory.

In some embodiments, 3D memory array 500 also includes a substrate contact 572 of the second substrate 530. Substrate contact 572 can be formed using similar material and process as substrate contact 472 of first substrate 430. Substrate contact 572 can provide electrical connection to second substrate 530 of 3D memory array 500.

Figure 6:
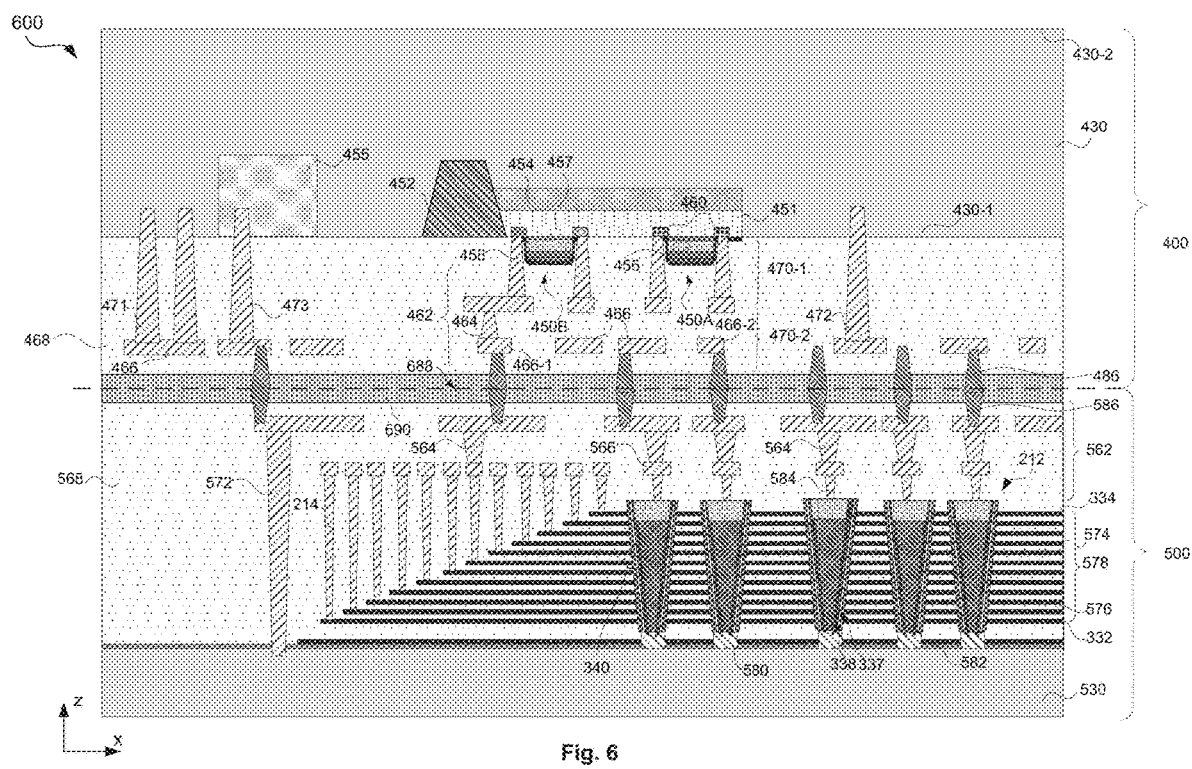
FIG. 6 illustrates a cross-sectional view of a 3D memory device after bonding the peripheral circuitry and the memory array, according to some embodiments of the present disclosure.

At operation 306, the peripheral circuitry wafer and the 3D memory array wafer are bonded, according to some embodiments of the present disclosure. Referring to FIG. 6, 3D memory device 600 is formed by wafer bonding peripheral circuitry 400 fabricated on first substrate 430 and 3D memory array 500 fabricated on second substrate 530. As shown in FIG. 6, peripheral circuitry 400 is flipped upside down and joined with the 3D memory array 500 through suitable wafer bonding processes such as direct bonding, hybrid bonding, anodic bonding, any suitable bonding processes, and/or combinations thereof. At a bonding interface 688, peripheral circuitry 400 and 3D memory array 500 are electrically connected through plurality of interconnect VIAs 486/586.

In some embodiments, bonding interface 688 of 3D memory device 600 situates between insulating layer 468 of peripheral interconnect layer 462 and insulating layer 568 of array interconnect layer 562. Interconnect VIAs 486 and 586 can be joined at bonding interface 688 to electrically connect any conductive line 466 or contact structure 464 of peripheral interconnect layer 462 and any conductive line 566 or contact structure 564 of the array interconnect layer 562. As such, peripheral circuitry 400 and 3D memory array 500 can be electrically connected.

In some embodiments, bonding interface 688 of 3D memory device 600 situates inside a bonding layer 690. In this example, interconnect VIAs 486 and 586 extend through bonding layer 690 and also form electrical connections between any conductive line 466 or contact structure 464 of peripheral interconnect layer 462 and conductive line 566 or contact structure 564 of array interconnect layer 562. As such, peripheral circuitry 400 and 3D memory array 500 can also be electrically connected.

In some embodiments, bonding layer 690 can be disposed on top of the peripheral circuitry 400 (in FIG. 4) and/or 3D memory array 500 (in FIG. 5) prior to bonding process. Bonding layer 690 can include dielectric materials such as silicon oxide, silicon nitride, silicon oxynitride or any combination thereof. Bonding layer 690 can also include adhesion materials, for example, epoxy resin, polyimide, dry film, photosensitive polymer, etc. Bonding layer 690 can be formed by one or more thin film deposition processes such as CVD, PVD, PECVD, ALD, high-density-plasma CVD (HDP-CVD), sputtering, spin-coating, or any combination thereof.

In some embodiments, after forming bonding layers 690, interconnect VIAs 486 and 586 can be formed for peripheral circuitry 400 and 3D memory array 500, respectively. Interconnect VIAs 486/586 can include metal or metal alloy such as copper (Cu), tin (Sn), nickel (Ni), gold (Au), silver (Ag), titanium (Ti), aluminum (Al), titanium nitride (TiN), tantalum nitride (TaN), etc., or any combination thereof. The metal or metal alloy of interconnect VIAs 486/586 can be disposed by one or more thin film deposition processes such as chemical vapor deposition (CVD), plasma-enhanced CVD (PECVD), physical vapor deposition (PVD), atomic layer deposition (ALD), electroplating, electroless plating, sputtering, evaporation, or any combination thereof. The fabrication process of interconnect VIAs 486/586 can further include, but not limited to, photolithography, wet/dry etching, planarization (e.g., CMP, or RIE etch-back), etc.

In some embodiments, peripheral circuitry 400 and 3D memory array 500 can be bonded together at die level (e.g., die-to-die, or chip-to-chip) or at wafer level (e.g., wafer-to-wafer or chip-to-wafer), depending on the product design and manufacturing strategy. Bonding at wafer level can provide high throughput, where a subset of or all the dies/chips on first substrate 430 with peripheral circuitry 400 can be joined simultaneously with second substrate 530 with 3D memory array 500. Individual 3D memory device 600 can be diced after wafer bonding. On the other hand, bonding at die level can be performed after dicing and die testing, where functional dies of peripheral circuitry 400 and 3D memory array 500 can be selected first and then bonded to form 3D memory device 600, enabling higher yield of 3D memory device 600.

In some embodiments, during the bonding process, peripheral interconnect layer 462 can be aligned with the array interconnect layer 562 when interconnect VIAs 486 of peripheral circuitry 400 are aligned with corresponding interconnect VIAs 586 of 3D memory array 500. As a result, corresponding interconnect VIAs 486/586 can be connected at bonding interface 688 and 3D memory array 500 can be electrically connected with the peripheral circuitry 400.

In some embodiments, peripheral circuitry 400 and 3D memory array 500 can be joined by hybrid bonding. Hybrid bonding, especially metal/dielectric hybrid bonding, can be a direct bonding technology (e.g., forming bonding between surfaces without using intermediate layers, such as solder or adhesives), which obtains metal-metal bonding and dielectric-dielectric bonding simultaneously. During the bonding process, chemical bonds can be formed at the metal-metal bonding surface and the dielectric-dielectric surface.

In some embodiments, peripheral circuitry 400 and 3D memory array 500 can be bonded by using the bonding layer 690. At bonding interface 688, the bonding can take place between silicon nitride to silicon nitride, silicon oxide to silicon oxide, or silicon nitride to silicon oxide, in addition to metal to metal bonding. In some embodiments, the bonding layer can also include an adhesive material to enhance bonding strength, for example, epoxy resin, polyimide, dry film, etc.

In some embodiments, a treatment process can be used to enhance the bonding strength at bonding interface 688. The treatment process can prepare the surfaces of array interconnect layer 562 and peripheral interconnect layer 462 so that the surfaces of insulating layers 562/462 form chemical bonds. The treatment process can include, for example, plasma treatment (e.g. with F, Cl or H containing plasma) or chemical process (e.g., formic acid). In some embodiments, the treatment process can include a thermal process that can be performed at a temperature from about 250° C. to about 600° C. in a vacuum or an inert ambient (e.g., with nitrogen or Argon). The thermal process can cause metal inter-diffusion between interconnect VIAs 486 and 586. As a result, metallic materials in the corresponding pairs of the interconnect VIAs can be inter-mixed with each other or forming alloy after the bonding process.

After bonding the peripheral and array interconnect layers together, at least one peripheral device of peripheral circuitry 400 fabricated on first substrate 430 can be electrically connected with at least one memory cell of 3D memory array 500 fabricated on second substrate 530. For example, conductive lines 466-1 that are electrically connected to the array of peripheral devices 450A and/or 450B can be electrically connected to one or more word line contact structures 214 through a plurality of contact levels containing conductive lines, contacts, and VIAs. Although FIG. 6 illustrates that peripheral circuitry 400 is bonded on top of 3D memory array 500, 3D memory array 500 can also be bonded on top of the peripheral circuitry 400.

Through bonding, 3D memory device 600 can function similar to a 3D memory where peripheral circuitry and memory array are fabricated on the same substrate (as shown in FIG. 1). By stacking 3D memory array 500 and peripheral circuitry 400 on top of each other, the density of 3D memory device 600 can be increased. In the meantime, the bandwidth of 3D memory device 600 can be increased because of the interconnect distance between peripheral circuitry 400 and 3D memory array 500 can be reduced by using the stacked design. After the bonding process, peripheral circuitry 400 has a backside 430-2 exposed and ready for subsequent processing.

Figure 7:
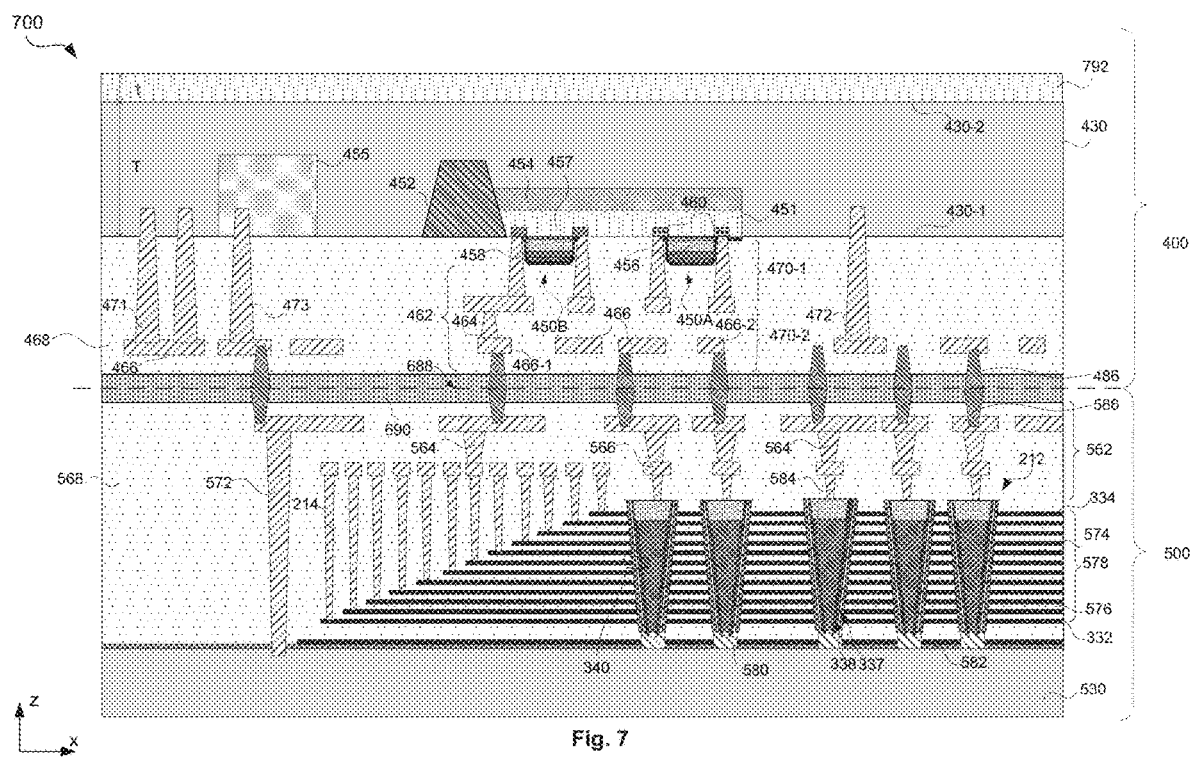
FIGS. 7-9 illustrate cross-sectional views of a 3D memory device at various process stages, according to some embodiments of the present disclosure.

At operation 308, the peripheral circuitry wafer is thinned down and a dielectric layer is disposed, according to some embodiments of the present disclosure. Referring to FIG. 7, 3D memory device 700 is illustrated to resemble 3D memory device 600 in FIG. 6, and also includes peripheral circuitry 400 and 3D memory array 500. Peripheral circuitry 400 is bonded to 3D memory array 500 at the bonding interface 688. 3D memory device 700 can be formed by thinning the first substrate 430 of peripheral circuitry 400 after forming 3D memory device 600 through bonding.

In some embodiments, first substrate 430 of peripheral circuitry 400 can be thinned down from backside 430-2. In some embodiments, substrate thinning process can include one or more of grinding, dry etching, wet etching, and chemical mechanical polishing (CMP). The thickness T of the first substrate 430 after thinning can be in a range between about 1 μm to about 5 μm. For example, thickness T can be between about 2 μm and about 4 μm. In some embodiments, the thin down process can continue until deep well 455 is exposed.

After first substrate 430 is thinned down, a dielectric layer 792 can be disposed on backside 430-2 (or the second side) of first substrate 430. Dielectric layer 792 can be any suitable semiconductor material, such as silicon oxide, silicon nitride, silicon oxynitride, doped silicon oxide (such as F-, C-, N- or H-doped oxides), tetraethoxysilane (TEOS), polyimide, spin-on-glass (SOG), low-k dielectric material such as porous SiCOH, silsesquioxan (SSQ), or any combination thereof. The insulating materials can be deposited by one or more thin film deposition processes such as CVD, PVD, PECVD, ALD, high-density-plasma CVD (HDP-CVD), sputtering, spin-coating, or any combination thereof. After deposition, dielectric layer 792 covers the entire surface of the first substrate 430. In some embodiments, thickness t of dielectric layer 792 can be between about 100 nm and about 1 μm. In some embodiments, thickness t can be between about 300 nm and about 600 nm. For example, thickness t can be about 500 nm.

Figure 8:
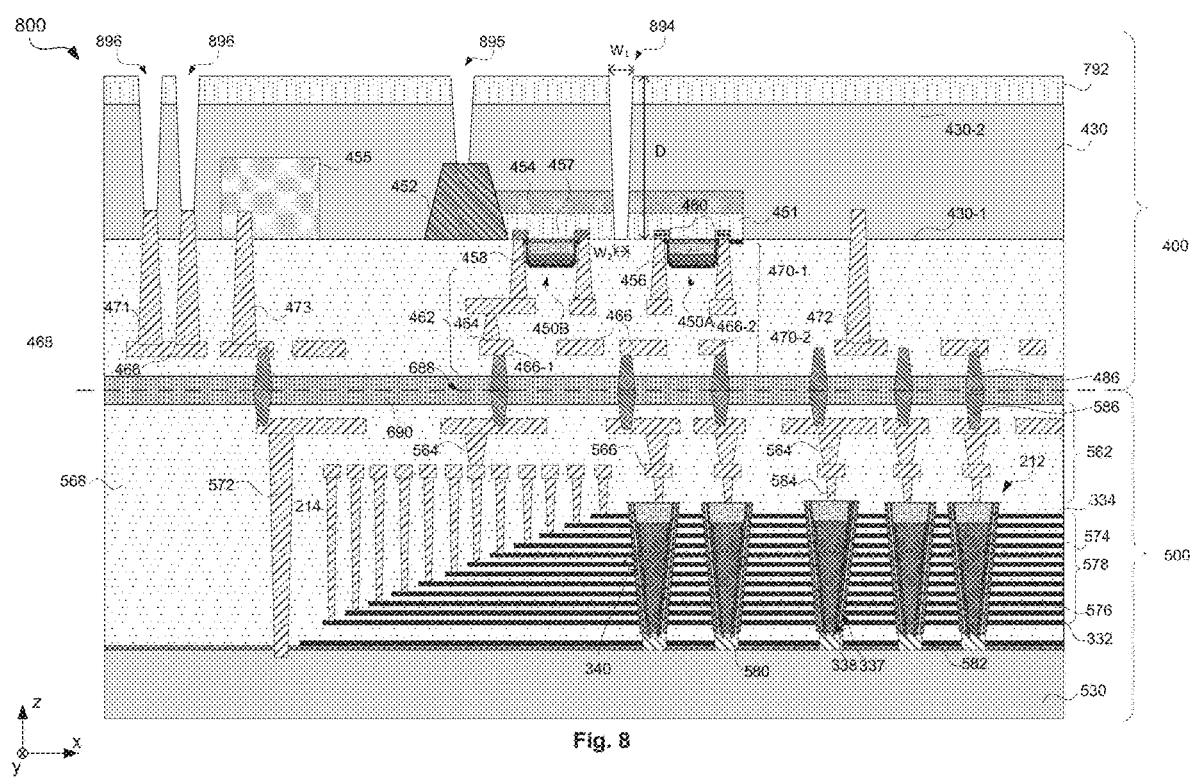

At operation 310, deep isolation trenches are formed in the peripheral circuitry wafer and between adjacent array of devices. Referring to FIG. 8, a 3D memory device 800 includes a plurality of deep isolation trenches 894 formed on backside 430-2 of first substrate 430. Isolation trenches penetrate through dielectric layer 792 and portions of first substrate 430 until first surface 430-1 of substrate 430 is exposed at the bottom of isolation trenches 894. In some embodiments, deep isolation trenches 894 also exposes portions of wells and other structures of peripheral devices 450A and 450B. For example, a plurality of trenches 895 can also be formed to expose top surfaces of STI structures 452.

In some embodiments, deep isolation trenches 894 and/or trenches 895 can extend in a lateral direction (e.g., x-direction or y-direction). In some embodiments, a portion of the plurality of deep isolation trenches 894 can extend in the x-direction and a portion can extend in the y-direction.

The cross-sectional shapes and numbers of deep isolation trenches can be determined by various factors, such as the need for device isolation and the type of devices. For example, a single deep isolation structure can be formed between an array of peripheral devices 450A and an array of peripheral devices 450B. In some embodiments, two or more deep isolation structures can be formed. The number of deep isolation structures needed can determine the number of deep isolation trenches formed. In some embodiments, any suitable number of deep isolation trenches can be used. Deep isolation trenches can also have any suitable cross-sectional shape. For example, cross-sectional shape of deep isolation trenches 894 illustrated in FIG. 8 can have a trapezoidal shape with top width $W_1$ measured at the top of deep isolation trenches 894 and bottom width $W_2$ measured at the bottom of deep isolation trenches 894. As illustrated in FIG. 8, deep isolation trenches 894 can have a greater width at the top than at the bottom of the structure, and such configuration can prevent voids in the subsequently disposed isolation material. In some embodiments, width $W_1$ can be in a range between about 0.1 μm and about 5 μm. For example, width $W_1$ can be about 0.5 μm. In some embodiments, width $W_2$ can be in a range between about 0.05 μm and about 0.25 μm. In some embodiments, widths $W_1$ and $W_2$ can be substantially the same. For example, widths $W_1$ and $W_2$ can be about 0.2 μm. In some embodiments, a top-to-bottom ratio $R_1$ of $W_1$ over $W_2$ can be between about 1.5 and about 2.5. For example, $R_1$ can be about 2. In some embodiments, as deep isolation trenches 894 can penetrate through both dielectric layer 792 and portions of first substrate 430, a depth D of deep isolation trenches 894 can be in a range between about 1 μm and about 6 μm. In some embodiments, a depth of STI 452 can be between about 300 nm and about 450 nm. In some embodiments, deep isolation trenches 894 can be formed on STI structures that are formed between peripheral devices 450A and 450B, and ratio of depth D over the combined thickness of thinned first substrate 430 and dielectric layer 792 (thicknesses T and t) can range between about 60% and about 95%. In some embodiments, an aspect ratio of deep isolation structures can be between about 10 and about 20. In some embodiments, the aspect ratio can be greater than about 20. In some embodiments, an angle α between bottom surface and sidewall surfaces of deep isolation trenches 894 can be in a range between about 90° and about 45°. In some embodiments, deep isolation trench 894 can have sidewalls that are substantially perpendicular to its bottom surface.

In some embodiments, trenches 895 and 896 can be formed concurrently with deep isolation trenches 894. Trenches 896 can be formed through dielectric layer 792 and first substrate 430. Trenches 896 can be aligned to underlying contacts 471, and the etching processes used to form trenches 896 can continue until surfaces of underlying contacts 471 are exposed, as shown in FIG. 8. In some embodiments, trenches 896 can be formed using a different process for forming deep isolation trenches 894.

Figure 9:
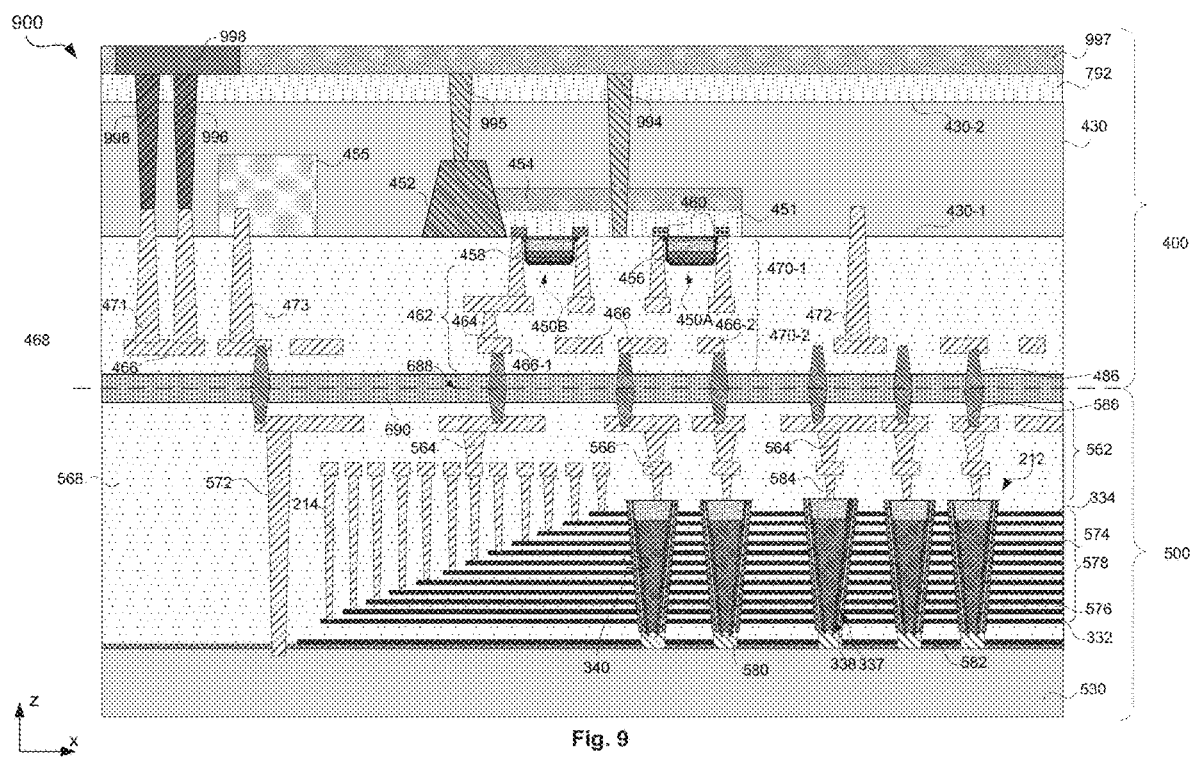

At operation 312, isolation material is disposed in the deep isolation trenches and a planarization process is performed, according to some embodiments, of the present disclosure. Referring to FIG. 9, deep isolation structures 994 are formed in deep isolation trenches 894 of a 3D memory device 900 by depositing isolation material and performing a planarization process. Deep isolation structures 994 can be used to prevent crosstalk that can occur between adjacent array of peripheral devices such as peripheral devices 450A and 450B. Deep isolation structures 994 can also prevent peripheral devices 450A and 450B from affecting any other surrounding devices. Deep isolation structures 994 can be in physical contact with first surface 430-1 of substrate 430. Deep isolation structures 994 can also extend through first and second wells 451 and 454. Isolation material can be any suitable material that prevents crosstalk between adjacent devices. For example, isolation material can be a low-k material (e.g., having dielectric constant less than about 3.9). In some embodiments, isolation material can be silicon oxide, silicon nitride, silicon oxynitride, silicon carbide, fluoride-doped silicate glass (FSG), any suitable dielectric material, and/or combinations thereof. In some embodiments, a liner layer can be disposed in deep isolation trenches 894 prior to the deposition of isolation material. For example, a liner layer (not illustrated in FIG. 9) can be a catalytic layer that promotes the adhesion of subsequently disposed isolation material or a barrier layer that can prevent possible contamination of first substrate due to the subsequent deposition of isolation material. For example, the liner layer can be silicon oxide, silicon nitride, silicon oxynitride, silicon carbide, silicon carbide nitride, titanium nitride, tantalum nitride, any suitable material, and/or combinations thereof. In some embodiments, the liner layer is positioned between the isolation material and first substrate 430. In some embodiments, liner layer can be deposited using a substantially conformal deposition process such as ALD or CVD processes. In some embodiments, liner layer can be between about 5 nm and about 50 nm.

In some embodiments, isolation material can be disposed by a blanket deposition process until deep isolation trenches 894 are fully filled with isolation material, followed by a planarization process that removes any excessive isolation material disposed on top surface of dielectric layer 792. The planarization process can be chemical-mechanical-polishing (CMP), reactive ion etching (RIE) process, wet etching process, a suitable processes, and/or combinations thereof. The planarization process can be performed until top surfaces of deep isolation structures 994 and dielectric layer 792 are substantially coplanar (e.g., level). In some embodiments, deep isolation structures 994 can be formed in any suitable locations of 3D memory device 900 where device isolation is needed.

Isolation material can also be disposed in trenches 895 to form isolation structures 995 that extends through dielectric layer 792 and substrate 430 and in physical contact with STI 452. Isolation structures 995 can prevent crosstalk between the array of peripheral devices and other adjacent structures such as deep well 455.

Conductive material can be deposited into trenches 896 to form through silicon contacts (TSC) 996. TSC 996 can be electrically coupled (e.g., electrically connected) to contacts 471 for conducting power and/or electrical signals. In some embodiments, trenches 896 can be filled with tungsten, copper, silver, aluminum, other suitable conducting materials, and/or combinations thereof. The conductive material can be formed using CVD, PVD, sputtering, electroplating, electroless plating, any suitable deposition methods, and/or combinations thereof. A CMP process can be performed on dielectric layer 792 and the conductive materials disposed in trenches 896, such that top surfaces of TSC 996, dielectric layer 792, and deep isolation structures 994 are substantially co-planar (e.g., level).

Dielectric layer 997 can be disposed on the top surfaces of TSC 996, dielectric layer 792, and deep isolation structures 994. In some embodiments, dielectric layer 997 can be formed using any suitable dielectric material such as low-k dielectric material (e.g., dielectric material having dielectric constant lower than about 3.9). In some embodiments, dielectric layer 997 can be formed using silicon oxide, silicon nitride, any suitable dielectric material, and/or combinations thereof.

One or more contact pads 998 can be formed in dielectric layer 997 and electrically coupled to underlying TSC 996. Contact pads 998 can be formed using tungsten, aluminum, copper, silver, any suitable conductive material, and/or combinations thereof. One or more contact pads 998 can provide as an access point for external control to electrically access and control the 3D memory device 900. In some embodiments, contact pads 998 can be formed by a patterning and etching process, such as a damascene process.

Figure 10A:
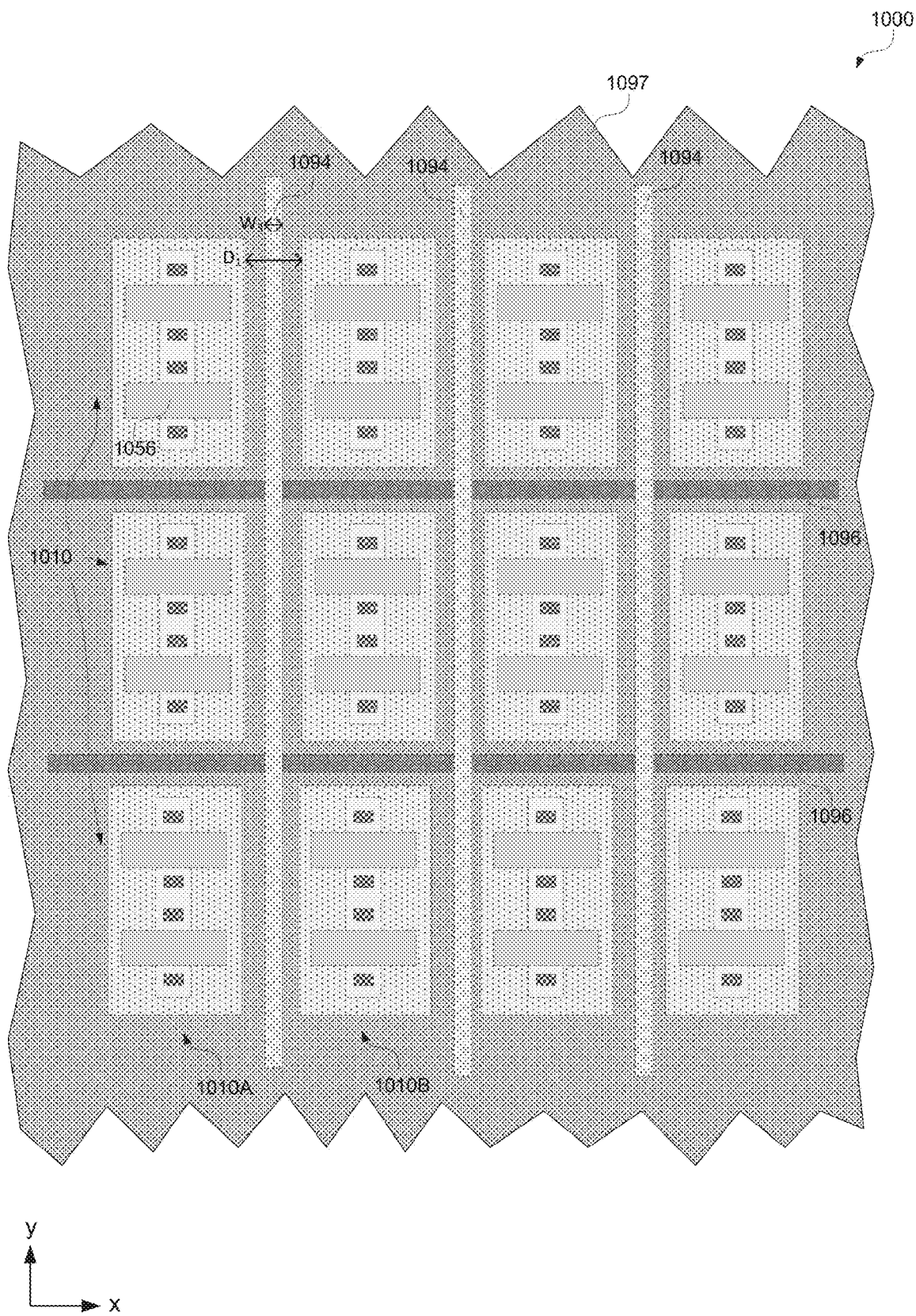
FIGS. 10A-10B illustrate top-down views of a 3D memory device, according to some embodiments of the present disclosure.
Figure 10B:
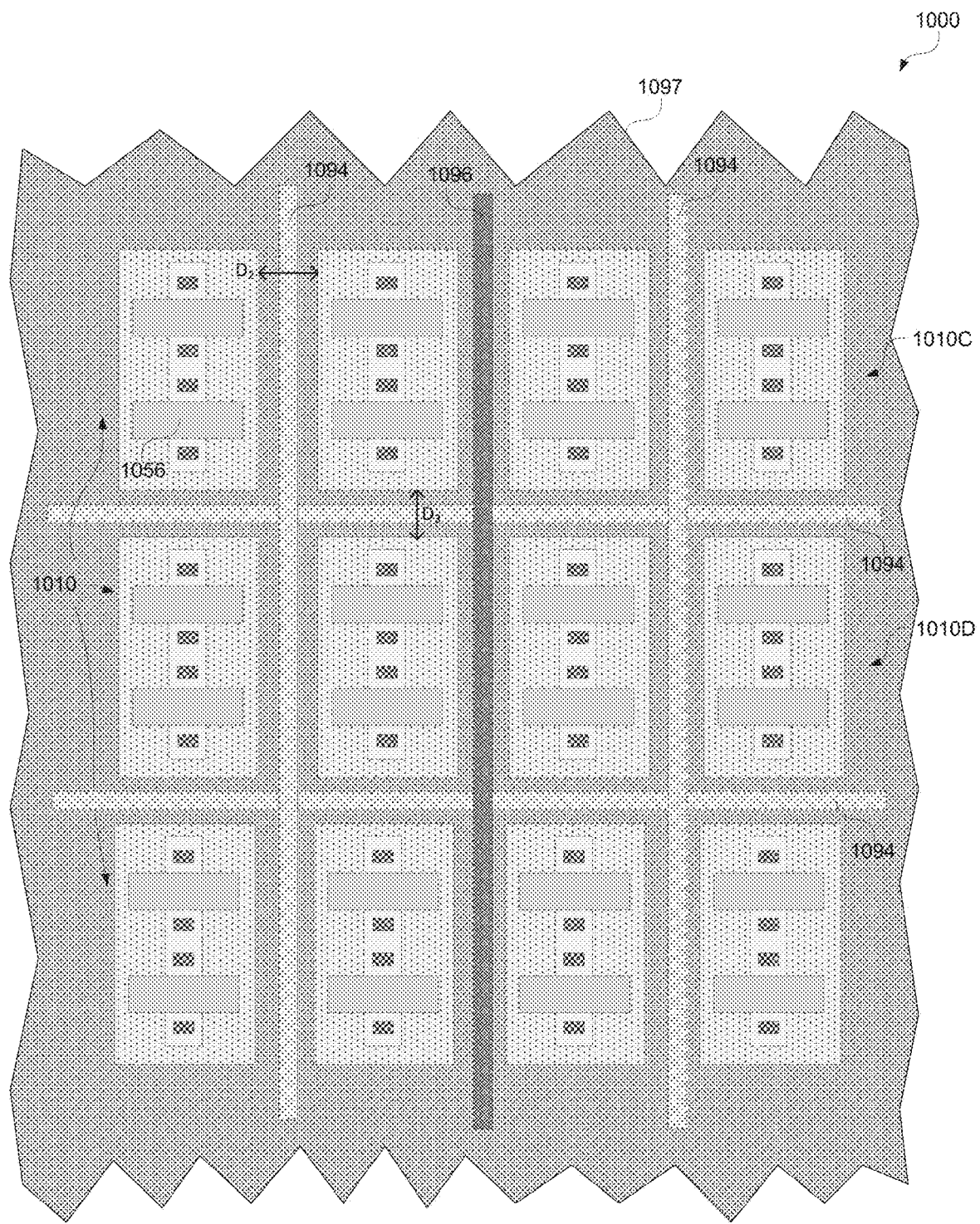

FIGS. 10A-10B illustrate top-down views of portions of exemplary three-dimensional (3D) memory device 1000, according to some embodiments of the present disclosure. 3D memory device 1000 includes dielectric layer 1097 and peripheral devices 1010 formed under dielectric layer 1097. Arrays of peripheral devices 1010 can be high-voltage devices such as high-voltage p-type devices and n-type devices formed in rows and/or columns. Dielectric layer 1097, peripheral devices 1010 can be respectively similar to dielectric layer 997 and peripheral devices 450A and 450B illustrated in FIG. 9, and are not described in detail here for simplicity. Referring to FIG. 9, peripheral devices 450A and 450B are formed below dielectric layer 997, therefore are not visible in a direct top-down view. For illustration purposes, arrays of peripheral devices 1010 are visible in FIGS. 10A-10B and are outlined with dashed lines for clarity.

As shown in FIG. 10A, arrays of peripheral devices 1010 can be electrically isolated by deep isolation structures 1094 which prevents crosstalk between adjacent devices, such as crosstalk between columns of peripheral devices 1010. For example, deep isolation structures 1094 can prevent crosstalk between column 1010A and column 1010B of the array of peripheral devices 1010. Deep isolation structures 1094 can be similar to deep isolation structures 994 illustrated in FIG. 9. In some embodiments, a deep isolation structure 1094 extends in the y-direction between adjacent pairs of columns of peripheral devices 1010, as shown in FIG. 10A. In some embodiments, one or more deep isolation structures 1094 can be formed between adjacent columns of peripheral devices 1010. In some embodiments, deep isolation structures 1094 can extend in the x-direction. Peripheral devices 1010 can include gate stacks 1056 that are similar to gate stacks 456 described above in FIG. 4. In some embodiments, gate stacks 456 can extend in the x-direction and/or extend in the y-direction. Deep isolation structures 1094 can provide isolation between adjacent columns of peripheral devices using much less device space compared to using doped regions or STI regions to electrically separate the adjacent columns. Therefore, separation $D_1$ between adjacent columns of arrays of peripheral devices 1010 can be separated by a smaller distance, such as between about 0.3 µm and about 0.5 µm. For example, separation $D_1$ can be about 0.5 µm. Width $W_3$ of deep isolation structures 1094 can be between about 0.1 and about 0.3 µm. Pickup regions 1096 can be formed between rows of peripheral devices 1010. Pickup regions 1096 can extend in the x-direction. Pickup regions 1096 can be heavily-doped regions that provide electrical connections to corresponding terminals of peripheral devices 1010. For example, pickup regions 1096 can be used to apply certain voltage bias to different types of wells (e.g., high-voltage n-type well, high-voltage p-type well, low-voltage n-type well, and/or low-voltage p-type well).

FIG. 10B illustrates deep isolation structures 1094 formed in both the x-direction and the y-direction. For example, deep isolation structures 1094 can be formed between rows 1010C and 1010D of arrays of peripheral devices 1010. In some embodiments, separation $D_2$ in the x-direction and between adjacent columns of arrays of peripheral devices 1010 can be similar to separation $D_1$ described above in FIG. 10A. For example, separation D2 can be about 0.5 µm. In some embodiments, separation $D_3$ in the y-direction and between rows 1010C and 1010D can be similar to separations $D_1$ and $D_2$. In some embodiments, separation $D_3$ can be different from separations $D_1$ and $D_2$.

Various embodiments in accordance with the present disclosure provide structures and fabricating methods for isolation structures that improves isolation between arrays of devices of 3D memory structures. A peripheral device wafer containing CMOS devices can be bonded to an array wafer containing 3D memory arrays. Isolation structures can be implemented in the bonded peripheral/memory array wafers to prevent crosstalk between adjacent arrays of semiconductor structures, such as between adjacent high-voltage n-type transistors for a decoder array used in 3D memory arrays. The isolation structures can be formed by thinning a dielectric layer of the peripheral wafer and forming through silicon isolation (TSI) structures to effectively separate different functional regions.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional memory device, comprising:
   forming, on a first side of a first substrate, a plurality of semiconductor devices arranged in an array of rows and columns;
   forming a first interconnect layer on the plurality of semiconductor devices;
   forming, on a second substrate, a memory array comprising a plurality of memory cells and a second interconnect layer;
   bonding the first and second interconnect layers;
   forming one or more isolation trenches through a second side of the first substrate that is opposite to the first side to expose a portion of the first side of the first substrate, wherein forming the one or more isolation trenches comprises forming an isolation trench between adjacent rows of semiconductor devices; and
   disposing an isolation material in the one or more isolation trenches to form one or more isolation structures.

2. The method of claim 1, further comprising thinning the first substrate after bonding the first and second interconnect layers, wherein the thinning forms the second side of the first substrate.

3. The method of claim 1, further comprising disposing a liner layer in the one or more isolation trenches before disposing the isolation material.

4. The method of claim 1, further comprising disposing a dielectric layer on the second side of the first substrate.

5. The method of claim 1, further comprising performing a planarization process to remove portions of the isolation material disposed on the second side of the first substrate.

6. The method of claim 1, wherein the plurality of semiconductor devices comprise high-voltage n-type devices or high-voltage p-type device.

7. The method of claim 1, further comprising:
   forming a trench in the first substrate and exposing a contact; and
   disposing conductive material in the trench and on the contact to form a through silicon contact (TSC), wherein the TSC is electrically coupled to the contact.

8. The method of claim 7, further comprising forming at least one contact pad on the TSC, wherein the at least one contact pad is electrically coupled to the TSC.

9. The method of claim 1, wherein disposing the isolation material comprises disposing silicon oxide material.

10. The method of claim 1, wherein forming the one or more isolation trenches comprises forming an other isolation trench between adjacent columns of the plurality of semiconductor devices.

11. The method of claim 1, wherein forming the one or more isolation trenches is performed after bonding the first and second interconnect layers.

12. A method for forming a three-dimensional memory device, comprising:
   forming, on a first side of a first substrate, a peripheral circuitry comprising a plurality of high-voltage semiconductor devices arranged in an array of rows and columns;
   forming a first interconnect layer on the peripheral circuitry;
   forming, on a second substrate, a memory array comprising a plurality of memory cells and a second interconnect layer;
   bonding the first and second interconnect layers, such that at least one high-voltage semiconductor device of the plurality of high-voltage semiconductor devices is electrically coupled to at least one memory cell of the plurality of memory cells;
   thinning the first substrate through a second side of the first substrate, wherein the second side is opposite to the first side;
   forming a plurality of isolation trenches through the second side of the first substrate to expose a portion of the first side of the first substrate, wherein forming the plurality of isolation trenches comprises forming at least one isolation trench between adjacent rows of high-voltage semiconductor devices arrays; and
   disposing an isolation material in the plurality of isolation trenches.

13. The method of claim 12, further comprising disposing a dielectric layer on the second side of the first substrate, wherein the plurality of isolation trenches extend through the dielectric layer.

14. The method of claim 12, further comprising disposing a liner layer in the at least one isolation trench before disposing the isolation material.

15. The method of claim 12, wherein forming the plurality of isolation trenches further comprises forming an other at least one isolation trench between adjacent columns of the plurality of high-voltage semiconductor devices.

16. A memory device, comprising:
   a peripheral circuitry wafer, comprising:
      a first substrate;
      a plurality of high-voltage devices formed at a first side of the first substrate and arranged in an array of rows and columns;
      a first interconnect layer formed at the first side of the first substrate; and
      a plurality of deep isolation structures formed on a second side of the first substrate that is opposite to the first side, wherein at least one deep isolation structure of the plurality of deep isolation structures extends through the first substrate and is in physical contact with the first side of the first substrate, and wherein the at least one deep isolation structure is between adjacent rows of high-voltage devices; and
   a memory array wafer, comprising:
      a plurality of memory cells on a second substrate, wherein at least one high-voltage device of the array of high-voltage devices is electrically coupled to at least one memory cell of the plurality of memory cells; and
      a second interconnect layer in physical contact with the first interconnect layer.

17. The memory device of claim 16, wherein the at least one deep isolation structure comprises a liner layer and isolation material, wherein the liner layer is between the isolation material and the first substrate.

18. The memory device of claim 16, wherein the at least one deep isolation structure comprises silicon oxide.

19. The memory device of claim 16, wherein the first substrate comprises a contact electrically coupled to a through silicon contact (TSC).

20. The memory device of claim 19, further comprising a contact pad in contact with and electrically coupled to the TSC.

21. The memory device of claim 16, wherein the plurality of deep isolation structures further comprises an other at least one deep isolation structure between adjacent columns of the plurality of high-voltage semiconductor devices.

* * * * *